United States Patent
Lim et al.

(10) Patent No.: US 7,404,169 B2
(45) Date of Patent: Jul. 22, 2008

(54) CLOCK SIGNAL NETWORKS FOR STRUCTURED ASIC DEVICES

(75) Inventors: Chooi Pei Lim, Penang (MY); Joo Ming Too, Kedah (MY); Yew Fatt (Edwin) Kok, Penang (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 330 days.

(21) Appl. No.: 11/141,867

(22) Filed: May 31, 2005

(65) Prior Publication Data

US 2006/0267661 A1 Nov. 30, 2006

(51) Int. Cl.
*G06F 17/50* (2006.01)
(52) U.S. Cl. ............... 716/16; 716/6; 716/7; 716/8; 716/9; 716/10
(58) Field of Classification Search ........... 716/6–14, 716/16–18; 326/41
See application file for complete search history.

(56) References Cited

U.S. PATENT DOCUMENTS 7,194,718 B2 * 3/2007 Sano et al. ............... 716/10

2006/0164121 A1 * 7/2006 Or-Bach et al. ........... 326/41
2006/0247875 A1 * 11/2006 Ooshima ................. 702/79

OTHER PUBLICATIONS

U.S. Appl. No. 10/884,460, Chua et al.
U.S. Appl. No. 11/097,633, Schleicher et al.

* cited by examiner

*Primary Examiner*—Paul Dinh
(74) *Attorney, Agent, or Firm*—Robert R. Jackson; Matthew S. Bertenthal; Ropes & Gray LLP

(57) ABSTRACT

Clock distribution circuitry for a structured ASIC device includes a deterministic portion and configurable portions. The deterministic portion employs a predetermined arrangement of conductor segments and buffers for distributing a clock signal to a plurality of predetermined locations on the device. From each predetermined location, an associated configurable portion of the clock distribution circuitry distributes the clock signal to any clock utilization circuitry needing that clock signal in a predetermined area of the structured ASIC that is served from that predetermined location.

14 Claims, 5 Drawing Sheets

CLOCK SIGNAL NETWORKS FOR STRUCTURED ASIC DEVICES

BACKGROUND OF THE INVENTION

This invention relates to clock signal distribution circuitry for integrated circuit devices of the type that are sometimes known as structured application-specific integrated circuits ("structured ASICs").

Structured ASICs are devices that have some predetermined circuit characteristics, but that are also customizable to some degree. For example, a structured ASIC may include a two-dimensional array of many relatively small logic elements (referred to herein as hybrid logic elements or HLEs). The basic circuitry of these HLEs is always the same or substantially the same, and is provided by a subset of the masks that are used to make the structured ASIC. Accordingly, the masks in this subset can be always the same or substantially the same. The overall function(s) performed by an HLE can be customized to some extent by customizing one or more additional masks used to make a particular structured ASIC product. Similarly, connections to, from, and/or between HLEs can be customized by customizing additional masks used to make the product. Because the structured ASIC always has the same basic circuitry, the task of designing it to perform particular tasks is greatly simplified, speeded up, increased in reliability, and reduced in cost. An entire ASIC does not have to be designed "from scratch." Instead, only the customizable masks have to be designed.

A possible use of structured ASIC technology is to produce ASICs that are functionally equivalent to programmed field-programmable gate arrays ("FPGAs"). After a logic design has been adequately "proven" in an FPGA, the design may be "migrated" to a structured ASIC. References such as Chua et al. U.S. patent application Ser. No. 10/884,460, filed Jul. 2, 2004, and Schleicher et al. U.S. patent application Ser. No. 11/097,633, filed Apr. 1, 2005, show this type of use of structured ASIC technology.

In structured ASICs of the type shown in the above-mentioned Chua et al. and Schleicher et al. references, the disposition (location or arrangement) of circuit functions (e.g., logic functions) on the structured ASIC can be quite different from the disposition of those functions on the FPGA that the structured ASIC is supposed to be functionally equivalent to. Accordingly, it may not be possible to simply duplicate on the structured ASIC the architecture of the circuitry that is provided on the related FPGA for routing or distributing clock signals to the functional circuitry. On the other hand, designing completely customized clock circuitry for each logic design that it may be desired to implement using the structured ASIC is not thought to be a good approach for a number of reasons, such as the cost and complexity of the design task and the great importance of well-designed clock networks to optimal performance of the structured ASIC.

SUMMARY OF THE INVENTION

In accordance with this invention, clock distribution circuitry for a structured ASIC device includes a deterministic portion and a plurality of configurable portions. The deterministic portion employs a predetermined arrangement of conductor segments and buffer circuits to distribute a clock signal to a plurality of predetermined locations on the device. A respective one of the configurable portions of the clock distribution circuitry is associated with each predetermined location and serves any clock utilization circuitry that is located in an area of the structured ASIC adjacent to that predetermined location. In particular, if an area associated with a predetermined location includes clock utilization circuitry, the configurable circuitry associated with that predetermined location is configured (custom-configured) to convey a clock signal received from the deterministic portion at the predetermined location to the clock utilization circuitry, wherever that clock utilization is located within the area.

Each configurable portion may include configurable conductors and configurable-portion buffer circuits. Each configurable portion may include a plurality of configurable subportions serving respective subareas of the area served by that configurable portion.

Logic element circuitry of the structured ASIC may be used to provide any or all of the above-mentioned buffer circuits. The logic element circuitry may employ relatively low metal layers of the structured ASIC. One or more higher metal layers may be used for the above-mentioned configurable conductors. One or more still higher metal layers may be used for the above-mentioned conductor segments of the deterministic portion.

Only as much of the clock distribution circuitry as is actually needed may be provided. For example, any logic element circuitry that is not needed for the above-mentioned buffer circuits may be used for other purposes (e.g., in logic circuitry of the structured ASIC). Any of the above-mentioned conductor segments of the deterministic portion that are not needed may be used for other purposes (e.g., as additional power distribution conductors). Only as much circuitry (if any) as is actually necessary may be provided in each of the configurable portions.

Further features of the invention, its nature and various advantages, will be more apparent from the accompanying drawings and the following detailed description.

DETAILED DESCRIPTION

Figure 1:
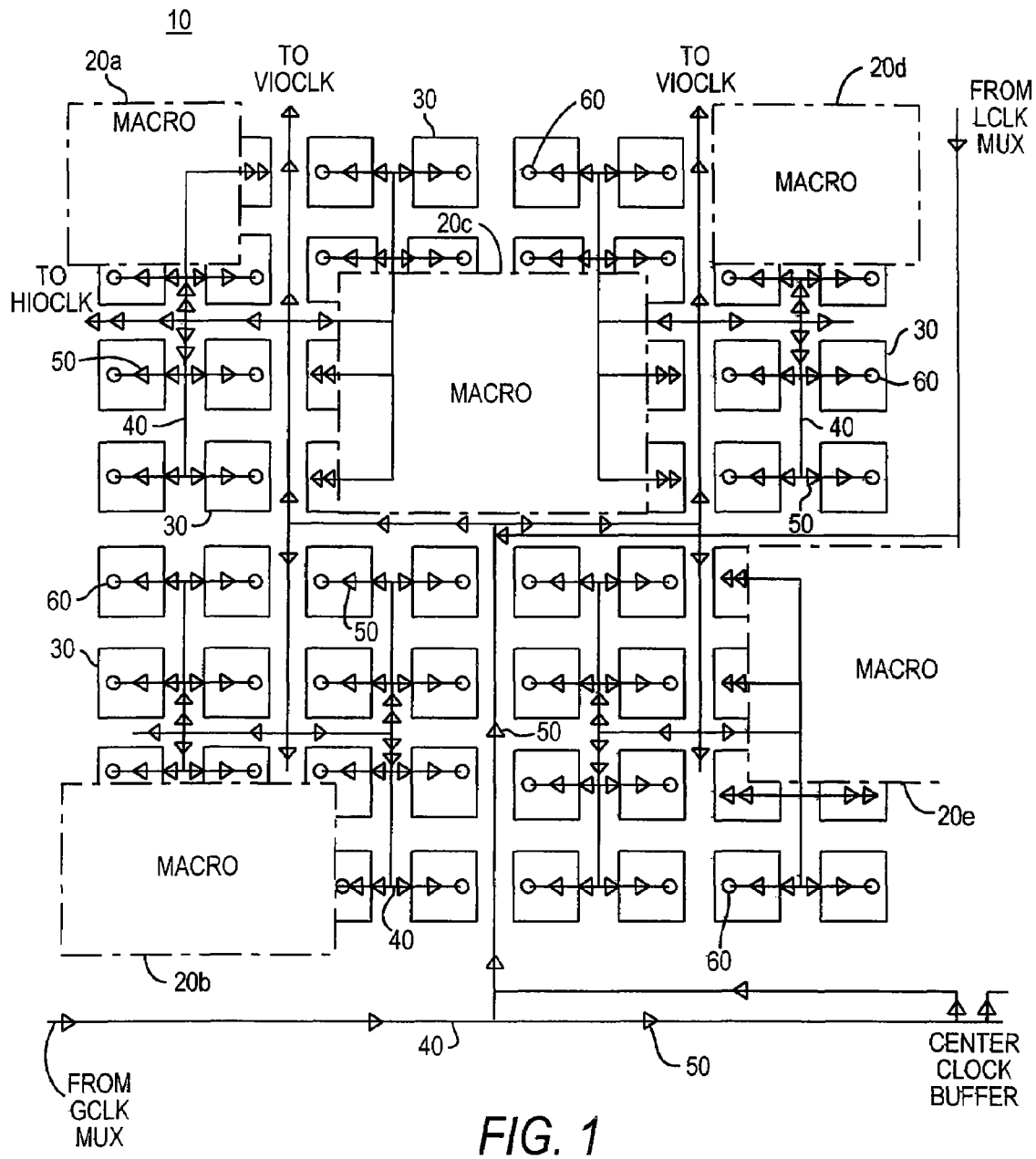
FIG. 1 is a simplified schematic block diagram of a representative portion of illustrative structured ASIC circuitry in accordance with the invention.

FIG. 1 shows a representative quadrant of an illustrative structured ASIC device 10 in accordance with the invention. In particular, FIG. 1 shows the upper left-hand quadrant of device 10. The other three quadrants may be generally similar. For example, the upper right-hand quadrant may be approximately a mirror image of what is shown in FIG. 1 about a vertical line in the general vicinity of the right-hand edge of the FIG. 1 circuitry. The lower left-hand quadrant may be approximately a mirror image of FIG. 1 about a horizontal line in the general vicinity of the bottom edge of the FIG. 1 circuitry. The lower right-hand quadrant may be approximately a mirror image of FIG. 1 about a line passing through the lower right-hand corner of the FIG. 1 circuitry but otherwise outside that circuitry and at 45° to either a horizontal or a vertical line.

FIG. 1 shows the following components: macros 20a, 20b, 20c, 20d, and 20e; groups of hybrid logic elements (HLEs) 30; clock signal distribution conductors 40; clock signal buffers 50; and connections 60 from conductors 40 to circuitry in groups of HLEs 30.

Macro circuits 20 are relatively unimportant to the present invention. Examples of macro circuits 20 are phase-locked loop circuitry, memory circuitry, and other circuits that are dedicated to performing particular types of circuit functions. As compared to the number of HLEs, these macro circuits are relatively few in number. They are at predetermined locations. They may need connections to the clock distribution circuitry, but this is not a major challenge because of factors such as their relatively small numbers and predetermined locations.

The more difficult problem for clock distribution is getting clock signals to the sea of HLEs. This is an important aspect of this invention.

Preliminarily the following should be noted. In the illustrative embodiment the HLEs employ metal layers 1-4. Conductors 40 employ metal layers 7 and 8 (horizontal conductors 40 are in metal 7 and vertical conductors 40 are in metal 8). Metal layers 5 and 6 are used, inter alia, for further clock distribution circuitry from connections 60 to the associated groups of HLEs 30. Each conductor line 40 in FIG. 1 may actually represent several parallel conductors that can be carrying different clock signals. For example there can be several so-called global clock signals that are available on conductors 40 throughout device. As another example, there may be various so-called local clock signals that are available to only one quadrant, or possibly to two edge-adjacent quadrants. Just as each line 40 may represent several parallel conductors, each buffer 50 may represent several instances of buffer circuitry, each instance serving respective conductors 40 entering and leaving the buffer location.

The architecture (general plan) of the conductors 40 (and buffers 50) shown in FIG. 1 is preferably predetermined in accordance with this invention. In other words, for the illustrative embodiment being discussed, FIG. 1 shows the layout of the clock distribution resources (conductors 40 and buffers 50) that is always used to distribute clock signals from whatever their sources to the connections 60 to the HLE groups 30. Accordingly, this may sometimes be referred to as the deterministic portion of the clock distribution circuitry of this invention. The word deterministic is used because this portion of the clock distribution circuitry has the predetermined architecture or arrangement shown in FIG. 1. Use of this deterministic circuitry has a number of important advantages in the present context. For example, it simplifies the task of designing clock circuitry that may need to deliver a clock signal to an HLE that is virtually anywhere in a large sea of HLEs. Only the final, relatively small and short portion of the clock distribution circuitry (from a connection 60 to one or more HLEs in the associated HLE group 30) needs to be designed in a more ad hoc, less deterministic way. As another example, the deterministic clock distribution circuitry can be pre-designed to always meet various objectives regarding such matters as permissible clock signal delay, permissible clock signal skew (differential delay to different parts of the clock distribution network), etc. The final, less deterministic (or configurable) portions of the clock distribution circuitry (i.e., from connections 60 to individual HLEs in the associated groups 30) are kept individually relatively small (e.g., by limiting the size of each group 30), so that these portions do not significantly alter the results achievable by using the deterministic circuitry. ("Results" in the preceding sentence refers to previously mentioned operating characteristics such as permissible clock signal delay, permissible skew, etc.)

With regard to issues such as delay and skew, it should be noted that the deterministic circuitry in FIG. 1 is laid out so that the distance through that circuitry from any clock signal source to any connection 60 is approximately the same and includes approximately the same number of buffers 50.

It will be understood that FIG. 1 shows only one illustrative embodiment of the deterministic circuitry, and that other embodiments (architectures or arrangements) are also possible. However, all structured ASIC products that are based on the illustrative architecture being described employ deterministic circuitry 40/50/60 having the general plan or arrangement shown in FIG. 1.

It will also be understood that although the circuitry 40/50/60 shown in FIG. 1 is basically deterministic, it is usable to achieve different clock distribution networks. For example, various conductors 40 in various portions of the depicted deterministic network can be connected to one another in various ways to distribute various clock signals in many different ways. As an example of this, a particular global clock signal on one of the leads represented by the lower-most horizontal conductor 40 in FIG. 1 may not be needed in the depicted quadrant. Accordingly, that global clock signal would not need to be connected into the further clock distribution circuitry shown in FIG. 1. These routing selections can be made by selecting how via connections are made between various conductors 40 in metal 7 and metal 8. As another example, if a global or local clock signal is not needed beyond a certain point in the deterministic network, distribution of that signal beyond that point can be cut off by not connecting the conductor 40 carrying that signal to the buffer 50 that would otherwise be provided at that point. (Local clock signals may come in on leads represented by the relatively long, right-most, vertical line in FIG. 1.) If desired, conductor segments 40 that are not used for clock distribution can be used instead for other purposes such as power distribution. Alternatively, conductor segments 40 and associated buffers 50 that are not used for clock distribution can be used for high fanout data signal distribution. As still another possibility, buffers 50 that are not used for clock distribution and that are in HLEs (see below) can be used for other purposes such as in logic.

Figure 2:
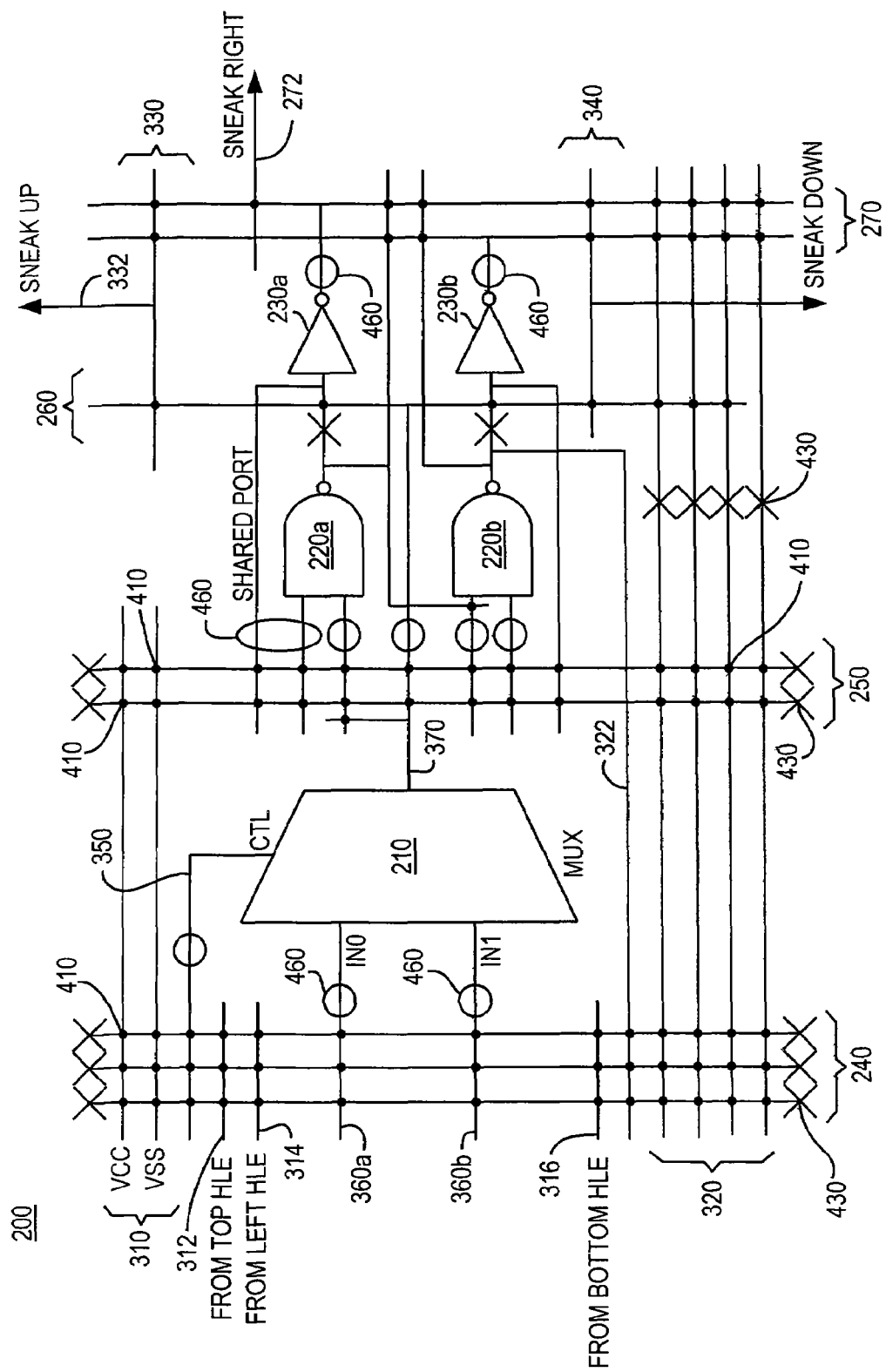
FIG. 2 is a simplified schematic block diagram of an illustrative embodiment of a representative portion of certain aspects of the circuitry shown in FIG. 1.

In accordance with another aspect of the invention, some or all of buffers 50 are preferably implemented using circuitry of HLEs. FIG. 2 shows an illustrative embodiment of an HLE 200. FIG. 2 herein is the same as FIG. 2 in the above-mentioned Schleicher et al. reference. It is also similar to FIG. 3 in the above-mentioned Chua et al. reference. These references describe this circuitry completely, so the description of it here can be somewhat abbreviated. Components of circuitry 200 include multiplexer 210; NAND gates 220; inverting drivers or buffers 230; vertical interconnection conductors 240, 250, 260, and 270; horizontal interconnection conductors 310, 312, 314, 316, 320, 322, 330, 340, 350, 360, 370; selectable internal connection sites 410 and 430; selectable adjacent HLE connection sites 430; and selectable higher-level connection sites 460.

Buffers 230, for example, can be used (inter alia) to buffer output signals of HLE 200. Alternatively, buffers 230 can be used to provide some or all of the buffering 50 shown in FIG. 1. In the latter case, for example, a clock signal to be buffered can be dropped from a metal 7 or metal 8 conductor 40 down through intervening layers to a port 460 in an adjacent HLE upstream from a buffer 230 in that HLE. If necessary, any connections necessary to apply that signal to that buffer 230 are made within HLE 200. The output signal of the buffer (i.e., a buffered and therefore strengthened version of the signal applied to the buffer) can then be returned to the next segment of the relevant metal 7' or metal 8 conductor 40.

The above-mentioned Chua et al. reference shows several ways that the buffering strength of HLE 200 can be selectively varied. Any of these techniques can be employed in the present context to provide buffers 50 of different strengths.

If an HLE 200 that is being used to provide a buffer 50 has components (e.g., multiplexer 210) that are not involved in the buffering, those components can be used for other purposes (e.g., to perform logic).

Figure 3:
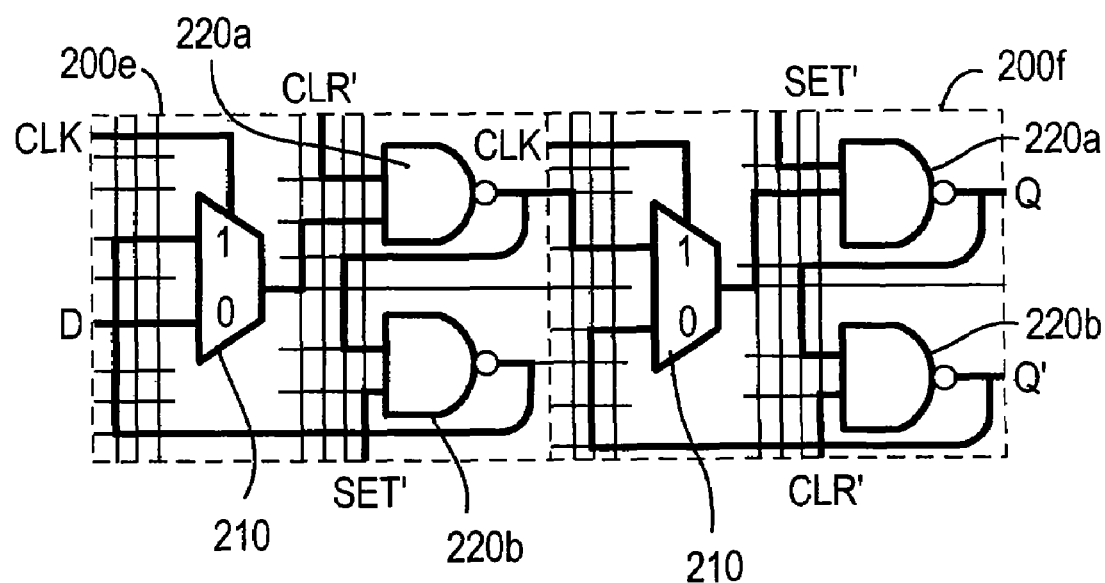
FIG. 3 is a simplified schematic block diagram of an illustrative embodiment of another representative portion of certain aspects of the circuitry shown in FIG. 1.

FIG. 3 shows that two adjacent HLEs (200e and 200f) can be used together to act as a flip-flop or register. FIG. 3 herein is the same as FIG. 13 in the above-mentioned Chua et al. reference and therefore does not require extensive discussion again here. It is noted, however, that FIG. 3 is a simplified depiction of HLEs 200e and 200f. These HLEs (like all HLES) actually include all the circuitry shown in FIG. 2. To simplify the depiction, however, FIG. 3 tends to show only the HLE elements and element interconnections (heavy lines) that are actually used to implement a flip-flop or register. The circuitry shown in FIG. 3 requires a clock signal to operate as a flip-flop or register. This circuitry is therefore an example of what is sometimes referred to herein as clock utilization circuitry.

Figure 4:
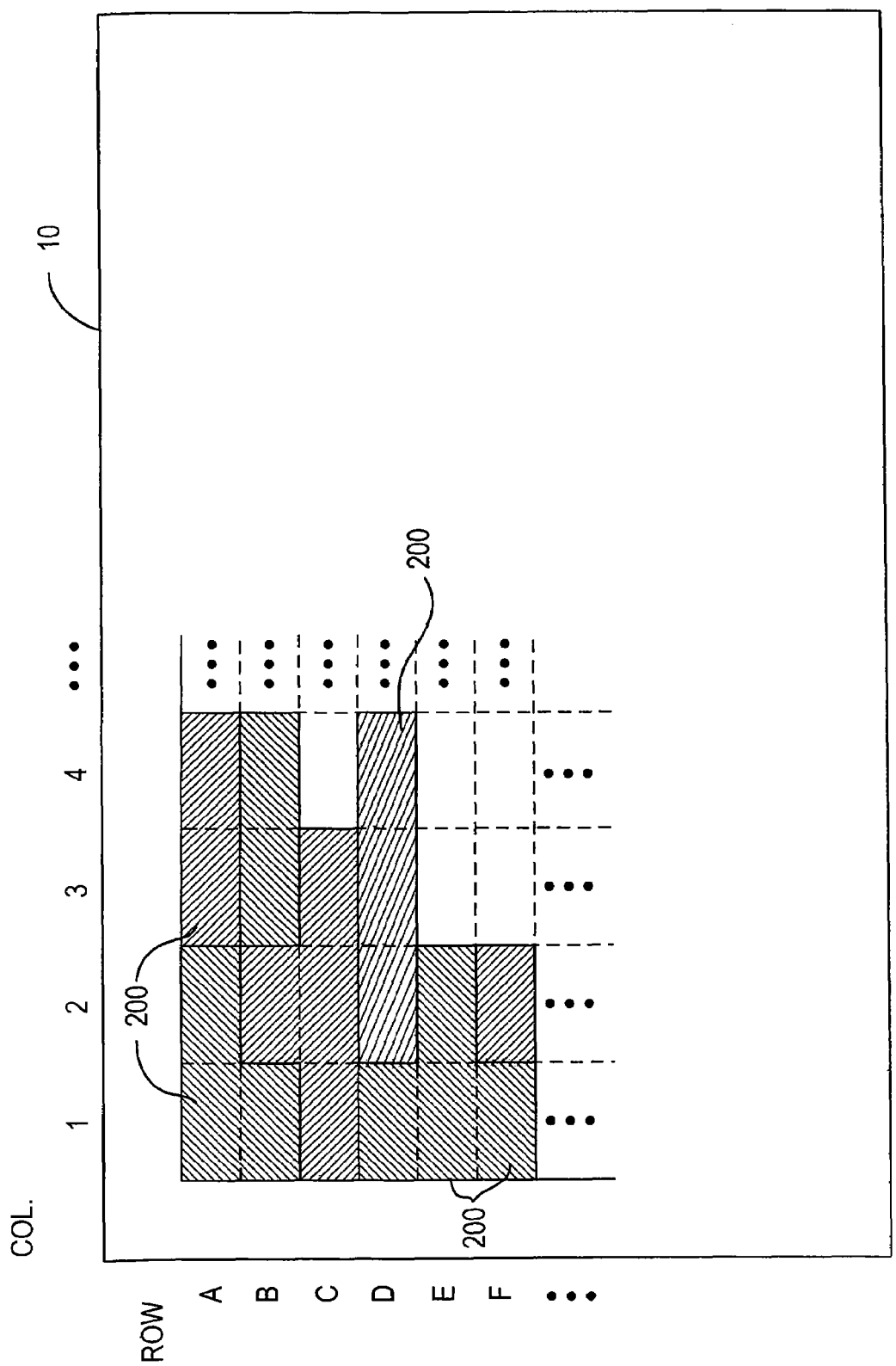
FIG. 4 is a simplified block diagram of an illustrative embodiment of a representative portion of certain aspects of the FIG. 1 circuitry.

FIG. 4 is included to emphasize that structured ASIC 10 includes a sea of HLEs 200. (FIG. 2 is similar to FIG. 16 in the above-mentioned Chua et al. reference.) Moreover, FIG. 4 shows (by means of different cross-hatching) how several adjacent or nearby HLEs may be used together to perform various logic functions that are desired by a user. Such groups or clusters of HLEs are called CHLEs. (These FIG. 4 "groups" are not the same as groups 30 in FIG. 1. The groups of the type discussed in connection with FIG. 4 tend to be relatively small (e.g., no more than six HLEs each), whereas each group 30 in FIG. 1 may contain several hundred HLEs.) Using the row and column references shown in FIG. 4, the following is a list of the HLEs 200 that are employed in each of the CHLEs depicted in FIG. 4:

---
CHLE 1: A1, A2, B1
CHLE 2: A3, A4
CHLE 3: B2, C1, C2, C3
CHLE 4: B3, B4
CHLE 5: D1, E1, E2, F1
CHLE 6: D2, D3, D4
CHLE 7: F2

---

The CHLE boundaries shown in FIG. 4 are only one of many possible CHLE boundary arrangements. This is truly a sea of HLEs 200 that can be grouped into CHLEs in a vast number of different ways to perform whatever logic the user wants to have performed. Moreover, a register (like that shown in FIG. 3) can occur virtually anywhere in this sea of HLEs. FIG. 4 thus points out the difficulty of designing good clock networks to get clock signals to these registers without the benefit of this invention.

Figure 5:
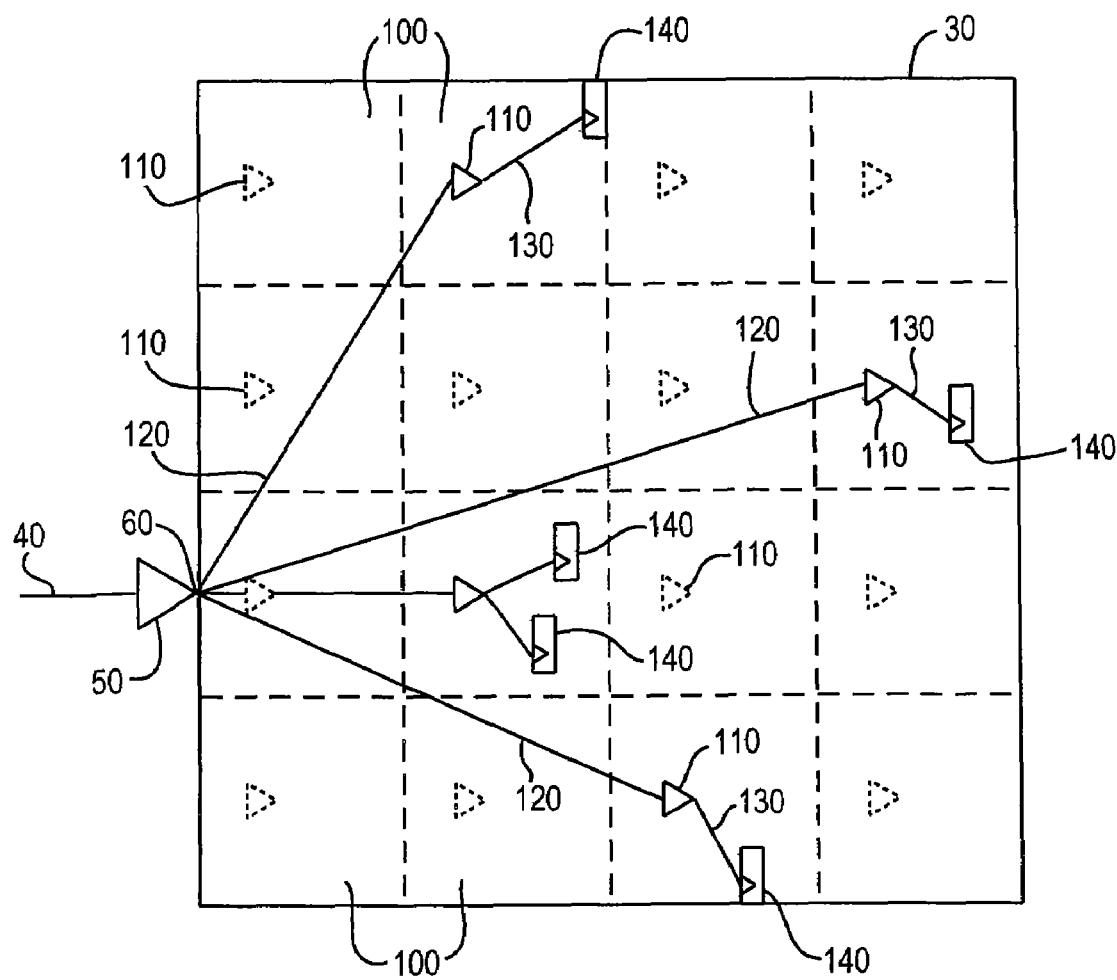
FIG. 5 is a simplified schematic block diagram of an illustrative embodiment of a representative portion of other aspects of the FIG. 1 circuitry.

FIG. 5 shows an illustrative embodiment of the circuitry beyond each of connections 60. The HLEs 200 (not shown individually) in each HLE group 30 are subdivided into 16 subgroups 100 of such HLEs. The subgroups 100 in group 30 are arranged in a two-dimensional array of intersecting rows and columns of the subgroups (four subgroups being included in each row and column). Each subgroup 100 includes a plurality of HLEs 200 (again not shown individually). The HLEs 200 in each subgroup 100 are preferably arranged in a two-dimensional array of intersecting rows and columns of HLEs (e.g., as in FIG. 4). The number of HLEs in a subgroup 100 is preferably not so large that the maximum number of registers that is likely to occur in such a subgroup will exceed the number that can be adequately supported by a final driver (buffer) 110 in that subgroup. For example, subgroups 100 may be sized so that the maximum number of registers that is likely to occur in a subgroup 100 is about 65.

FIG. 5 shows the final conductor leg 40 and final buffer 50 in a representative portion of the deterministic clock distribution circuitry shown in FIG. 1. Connection 60 at the output of buffer 50 takes the buffer output signal down to metal layers 5 and/or 6, which are used to distribute the buffer 50 output signal to each subgroup 100 that includes at least one register 140 needing the clock signal output by the depicted buffer 50. In particular, conductors 120 are provided in metal 5 and/or metal 6 from connection 60 to a buffer 110 in each subgroup 100 requiring the output signal of buffer 50. Like buffers 50, buffers 110 are preferably implemented using circuitry of an HLE 200 within the subgroup 100 that includes that buffer 110. If a subgroup 100 does not need the output signal of depicted buffer 50, then the buffer HLE 200 in that subgroup can be completely released for other service (e.g., for use in logic). The possible buffers 110 in the left-hand column of subgroups 100 in FIG. 5 are examples of HLE buffers that are not needed and can therefore be used for other purposes. The output signal of each buffer 110 is applied to the clock input terminal of each register 140 in the associated subgroup 100 that needs the clock signal output by that buffer 110. Conductors 130 (again in metal 5 and/or metal 6) provide these connections from buffers 110 to the associated registers 140.

As has been said, the portion of the clock distribution circuitry of this invention that is shown in FIG. 1 is sometimes referred to herein as the deterministic portion of that circuitry. Circuitry like that shown in FIG. 5 to the right of connection 60 is sometimes referred to herein as the configurable portion of the clock distribution circuitry of the invention. The deterministic (FIG. 1) portion of the circuitry is referred to as deterministic because it generally follows a predetermined pattern, e.g., with regard to the locations of conductor segments 40 and buffers 50. This does not mean that the so-called deterministic portion is not configurable in some respects. For example, some conductor segments 40 may be omitted in some structured ASICs made according to this general plan. Similarly, some buffers 50 may be omitted. In general, however, the deterministic portion of the circuitry always follows the same pattern or type of pattern shown in FIG. 1 for all structured ASIC products having this illustrative, general plan. In other words, to the extent that a conductor segment 40 is needed and therefore used, it is located as shown generally in FIG. 1. Similarly, buffers 50 are located generally as shown in FIG. 1 whenever conductor segments 40 that are in use for clock distribution are connected to one another at such a buffer 50 location.

Circuitry like that shown in FIG. 5 is referred to as configurable because buffers 110 and conductors 120 and 130 are provided only when, where, and in the numbers actually needed in a particular structured ASIC product. For example, the routing of conductors 120 can vary from product to product. (Although shown as single straight lines in FIG. 5, each conductor 120 may actually be made up of two or more segments at right angles to one another.) The same is true for conductors 130. There may be minor aspects of the circuitry shown in FIG. 5 that are somewhat deterministic. For example, the location of connection 60 relative to group 30 may be predetermined, and/or the locations of buffers 110 in subgroups 100 may be predetermined. In general, however, the FIG. 5 circuitry is predominantly configurable (i.e., not predetermined) and therefore at least potentially quite different from one structured ASIC product to the next, even though all of those products follow the same general plan in their deterministic respects.

It will be understood that the foregoing is only illustrative of the principles of the invention, and that various modifications can be made by those skilled in the art without departing from the scope and spirit of the invention. For example, the general plan of the clock distribution circuitry shown in FIG. 1 is only illustrative, and other general plans can be used instead if desired. As another example, the number of subgroups 100 in a group 30 can be different from the number shown in FIG. 5. Different numbers of HLEs can be included in each subgroup 100 in structured ASICs having different general plans. The circuitry of each HLE 200 can be different from the illustrative embodiment shown in FIG. 2.

The invention claimed is:

1. Clock distribution circuitry for a structured ASIC comprising:
   a deterministic portion that distributes a clock signal to any of a plurality of predetermined locations that are spaced from one another on the structured ASIC;
   a plurality of configurable portions, each of which is associated with a respective one of the predetermined locations for distributing a clock signal received from the deterministic portion at the associated predetermined location to clock utilization circuitry at any of various locations within a predetermined area adjacent to the associated predetermined location, wherein each of the predetermined areas includes a plurality of predetermined subareas, each of which includes clock utilization circuitry at any of a plurality of locations within the subarea, and wherein each configurable portion associated with an area that includes at least one subarea having clock utilization circuitry comprises:
      a configurable subportion associated with each of the subareas that includes clock utilization circuitry, comprising:
         a subportion buffer circuit;
         a configurable conductor from the predetermined location associated with that configurable portion to each subportion buffer circuit that is part of that configurable portion;
         a configurable subportion conductor from the subportion buffer circuit to each clock utilization circuitry in the subarea associated with that configurable subportion; and
      a two-dimensional array of logic elements, wherein circuitry of the logic elements is operable to provide the subportion buffer circuits and logic functions in response to being released from providing the subportion buffer circuits.

2. The circuitry defined in claim 1 wherein the deterministic portion includes:
   a predetermined arrangement of conductor segments; and
   a plurality of buffer circuits between successive ones of the conductor segments.

3. The circuitry defined in claim 2 wherein the structured ASIC includes a two-dimensional array of logic elements, and wherein circuitry of the logic elements is used to provide the buffer circuits of the deterministic portion.

4. The circuitry defined in claim 3 wherein the logic elements employ relatively low metal layers of the structured ASIC, and wherein the conductor segments employ at least one metal layer that is above the relatively low metal layers.

5. The circuitry defined in claim 1 wherein the logic elements employ relatively low metal layers of the structured ASIC, and wherein the configurable conductors and the configurable subportion conductors employ at least one metal layer that is above the relatively low metal layers.

6. The circuitry defined in claim 5 wherein the deterministic portion includes:
   a predetermined arrangement of conductor segments; and
   a plurality of buffer circuits between successive ones of the conductor segments.

7. The circuitry defined in claim 6 wherein circuitry of the logic elements is used to provide the buffer circuits of the deterministic portion.

8. The circuitry defined in claim 7 wherein the conductor segments employ at least one metal layer that is above the at least one metal layer that is employed for the configurable conductors and the configurable subportion conductors.

9. Structured ASIC circuitry comprising:
   an array of logic elements that are grouped into a plurality of groups, each of which groups includes a respective subplurality of the logic elements, and each of which groups is adjacent to a respective predetermined location on the structured ASIC;
   a predetermined pattern of clock distribution circuitry for at least potentially distributing at least one clock signal to each of the predetermined locations; and
   configurable clock distribution circuitry associated with each of the groups that includes clock utilization circuitry for distributing at least one clock signal from the predetermined pattern at the predetermined location associated with that group to the clock utilization circuitry in that group, wherein each of the groups comprises a plurality of subgroups of the logic elements, and wherein the configurable clock distribution circuitry comprises:
      a buffer circuit for each of the subgroups that includes clock utilization circuitry, wherein circuitry of the logic elements is operable to provide the buffer circuits and logic functions in response to being released from providing the buffer circuits;
      a first conductor segment from the predetermined location associated with the group including clock utilization circuitry to the buffer circuit for each subgroup in that group that includes clock utilization circuitry; and
      a second conductor segment from each of the buffer circuits to each clock utilization circuitry in the subgroup associated with that buffer circuit.

10. The circuitry defined in claim 9 wherein the predetermined pattern comprises:
    conductor segments; and
    buffer circuitry interconnecting successive ones of the conductor segments.

11. The circuitry defined in claim 10 wherein circuitry of the logic elements is used to provide the buffer circuitry of the predetermined pattern.

12. The circuitry defined in claim 9 further comprising:
    buffer circuitry interconnecting the predetermined pattern and the configurable clock distribution circuitry at each of the predetermined locations associated with a group that includes clock utilization circuitry.

13. The circuitry defined in claim 12 wherein circuitry of the logic elements is used to provide the buffer circuitry interconnecting the predetermined pattern and the configurable clock distribution circuitry.

14. Structured ASIC circuitry comprising:

a two-dimensional array of logic elements that are grouped into a two-dimensional array of groups of the logic elements;

a predetermined pattern of clock distribution circuitry for at least potentially distributing at least one clock signal to each of the groups; and configurable clock distribution circuitry associated with each of the groups that includes clock utilization circuitry for distributing at least one clock signal from the predetermined pattern at a predetermined location adjacent to that group to the clock utilization circuitry in that group, wherein each of the groups comprises a plurality of subgroups of the logic elements, and wherein the configurable clock distribution circuitry comprises:

a buffer circuit for each of the subgroups that includes clock utilization circuitry, wherein circuitry of the logic elements is operable to provide the buffer circuits and logic functions in response to being released from providing the buffer circuits;

a first conductor segment from the predetermined location associated with the group including clock utilization circuitry to the buffer circuit for each subgroup in that group that includes clock utilization circuitry; and a second conductor segment from each of the buffer circuits to each clock utilization circuitry in the subgroup associated with that buffer circuit.

\* \* \* \* \*